(12) United States Patent
Kim et al.

(10) Patent No.: US 9,960,170 B1
(45) Date of Patent: May 1, 2018

(54) METHODS OF FABRICATING MEMORY DEVICES

(71) Applicant: SAMSUNG ELECTRONICS CO., LTD., Suwon-si, Gyeonggi-do (KR)

(72) Inventors: Daeik Kim, Hwaseong-si (KR); Kiseok Lee, Hwaseong-si (KR); Keunnam Kim, Yongin-si (KR); Bong-Soo Kim, Yongin-si (KR); Jemin Park, Suwon-si (KR); Chan-Sic Yoon, Anyang-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/614,077

(22) Filed: Jun. 5, 2017

(30) Foreign Application Priority Data

Oct. 31, 2016 (KR) .................. 10-2016-0143500

(51) Int. Cl.
*H01L 21/8242* (2006.01)
*H01L 27/108* (2006.01)

(52) U.S. Cl.
CPC .. *H01L 27/10897* (2013.01); *H01L 27/10814* (2013.01); *H01L 27/10823* (2013.01); *H01L 27/10885* (2013.01); *H01L 27/10888* (2013.01); *H01L 27/10894* (2013.01)

(58) Field of Classification Search
CPC ....... H01L 21/76224; H01L 21/823412; H01L 27/10805; H01L 27/10814; H01L 27/10817; H01L 27/10873; H01L 27/10876; H01L 27/10879; H01L 27/10897; H01L 27/10823; H01L 27/10885; H01L 27/10888; H01L 27/1089

USPC ................. 438/210, 239, 253, 396
See application file for complete search history.

(56) References Cited

U.S. PATENT DOCUMENTS

| | | | |
|---|---|---|---|
| 8,357,600 B2 | 1/2013 | Shin et al. | |
| 8,536,009 B2 | 9/2013 | Javorka et al. | |
| 8,557,664 B2 | 10/2013 | Cho et al. | |
| 9,082,647 B2 | 7/2015 | Jang et al. | |
| 9,305,928 B2 | 4/2016 | Kim et al. | |
| 2009/0057778 A1* | 3/2009 | Dreeskornfeld | .. H01L 27/10876 257/392 |

(Continued)

FOREIGN PATENT DOCUMENTS

| | | |
|---|---|---|
| KR | 10-2014-0110146 A | 9/2014 |
| KR | 10-2015-0051513 A | 5/2015 |

(Continued)

*Primary Examiner* — Brook Kebede
(74) *Attorney, Agent, or Firm* — Myers Bigel, P.A.

(57) ABSTRACT

Methods of fabricating a memory device are provided. The methods may include forming a mask pattern including line-shaped portions that are parallel to each other and extend on a first region of a substrate. The mask pattern may extend on a second region of the substrate. The methods may also include forming word line regions in the first region using the mask pattern as a mask, forming word lines in the word line regions, respectively, and removing the mask pattern from the second region to expose the second region. The mask pattern may remain on the first region after removing the mask pattern from the second region. The methods may further include forming a channel epitaxial layer on the second region while using the mask pattern as a barrier to growth of the channel epitaxial layer on the first region.

20 Claims, 6 Drawing Sheets

(56) References Cited

U.S. PATENT DOCUMENTS

| | | |
|---|---|---|
| 2014/0246729 A1 | 9/2014 | Jang et al. |
| 2015/0303201 A1 | 10/2015 | Lee et al. |
| 2016/0079246 A1* | 3/2016 | Kim .................. H01L 21/76224 257/401 |
| 2016/0148934 A1 | 5/2016 | Ji et al. |
| 2016/0163708 A1 | 6/2016 | Jang et al. |

FOREIGN PATENT DOCUMENTS

| | | |
|---|---|---|
| KR | 10-2015-0088634 A | 8/2015 |
| KR | 10-2015-0121767 A | 10/2015 |
| KR | 10-2016-0067618 A | 6/2016 |

\* cited by examiner

METHODS OF FABRICATING MEMORY DEVICES

CROSS-REFERENCE TO RELATED APPLICATION

This U.S. nonprovisional patent application claims priority under 35 U.S.C. § 119 to Korean Patent Application No. 10-2016-0143500 filed on Oct. 31, 2016, the disclosure of which is hereby incorporated by reference in its entirety.

BACKGROUND

The present inventive concepts relate to methods of fabricating a semiconductor memory device.

Semiconductor devices are considered as an important factor in the electronics industry because of their small size, multi-function, and/or low fabrication cost. The semiconductor devices are being highly integrated with the remarkable development of the electronics industry. Line widths of patterns of the semiconductor devices are being reduced for high integration of the semiconductor devices. However, new exposure techniques and/or expensive exposure techniques may be used for forming fine patterns such that it may be difficult to highly integrate the semiconductor devices. Thus, various research has recently been conducted for new integration techniques.

In addition, performance of transistors on a peripheral circuit region besides a cell array region may also be important for overall performance of the semiconductor memory devices. Various studies have been under way for this purpose.

SUMMARY

Embodiments of the present inventive concepts provide methods of fabricating a semiconductor memory device capable of manufacturing a semiconductor memory device having excellent performance.

According to example embodiments of the present inventive concepts, a method of fabricating a semiconductor memory device may include providing a substrate including a first region and a second region and forming a mask pattern including a plurality of line-shaped portions that are parallel to each other and extend in a first direction on the first region of the substrate. The mask pattern may extend on the second region of the substrate. The method may also include forming a plurality of word line regions in the first region of the substrate using the mask pattern as a mask, forming a plurality of word lines in the plurality of word line regions, respectively, and removing the mask pattern from the second region of the substrate to expose the second region of the substrate. The mask pattern may remain on the first region of the substrate after removing the mask pattern from the second region of the substrate. The method may further include forming a channel epitaxial layer on the second region of the substrate while using the mask pattern as a barrier to growth of the channel epitaxial layer on the first region of the substrate.

According to example embodiments of the present inventive concepts, a method of fabricating a semiconductor memory device may include providing a substrate including a cell array region and a PMOS region, and forming a mask pattern including a plurality of line-shaped portions that are parallel to each other and extend in a first direction on the cell array region. The mask pattern may extend on the PMOS region. The method may also include forming a plurality of grooves that are parallel to each other on the cell array region by etching the substrate using the mask pattern as an etch mask, sequentially forming gate dielectric layers, word lines, and capping patterns in the plurality of grooves, respectively and removing the mask pattern from the PMOS region to expose the PMOS region. The mask pattern may remain on the cell array region after removing the mask pattern from the PMOS region. The method may further include selectively forming a silicon germanium (SiGe) layer on the PMOS region while using the mask pattern as a barrier to growth of the silicon germanium layer on the cell array region.

According to example embodiments of the present inventive concepts, a method of forming a memory device may include forming a mask layer on a substrate that includes a first region and a second region. The mask layer may include a first opening exposing the first region and extending on the second region. The method may also include etching the substrate using the mask layer as an etch mask to form a recess in the first region of the substrate, forming a word line in the recess, removing the mask layer from the second region of the substrate after forming the word line, to expose the second region of the substrate, forming an epitaxial layer on the exposed second region of the substrate, sequentially forming an insulation layer and a conductive layer on the epitaxial layer, and patterning the conductive layer to form a gate electrode of a transistor on the epitaxial layer. The epitaxial layer may include a channel region of the gate electrode of the transistor.

DETAILED DESCRIPTION OF EMBODIMENTS

Example embodiments of the present inventive concepts in conjunction with the accompanying drawings will be hereinafter described in detail. As used herein the term "and/or" includes any and all combinations of one or more of the associated listed items.

Figure 1:
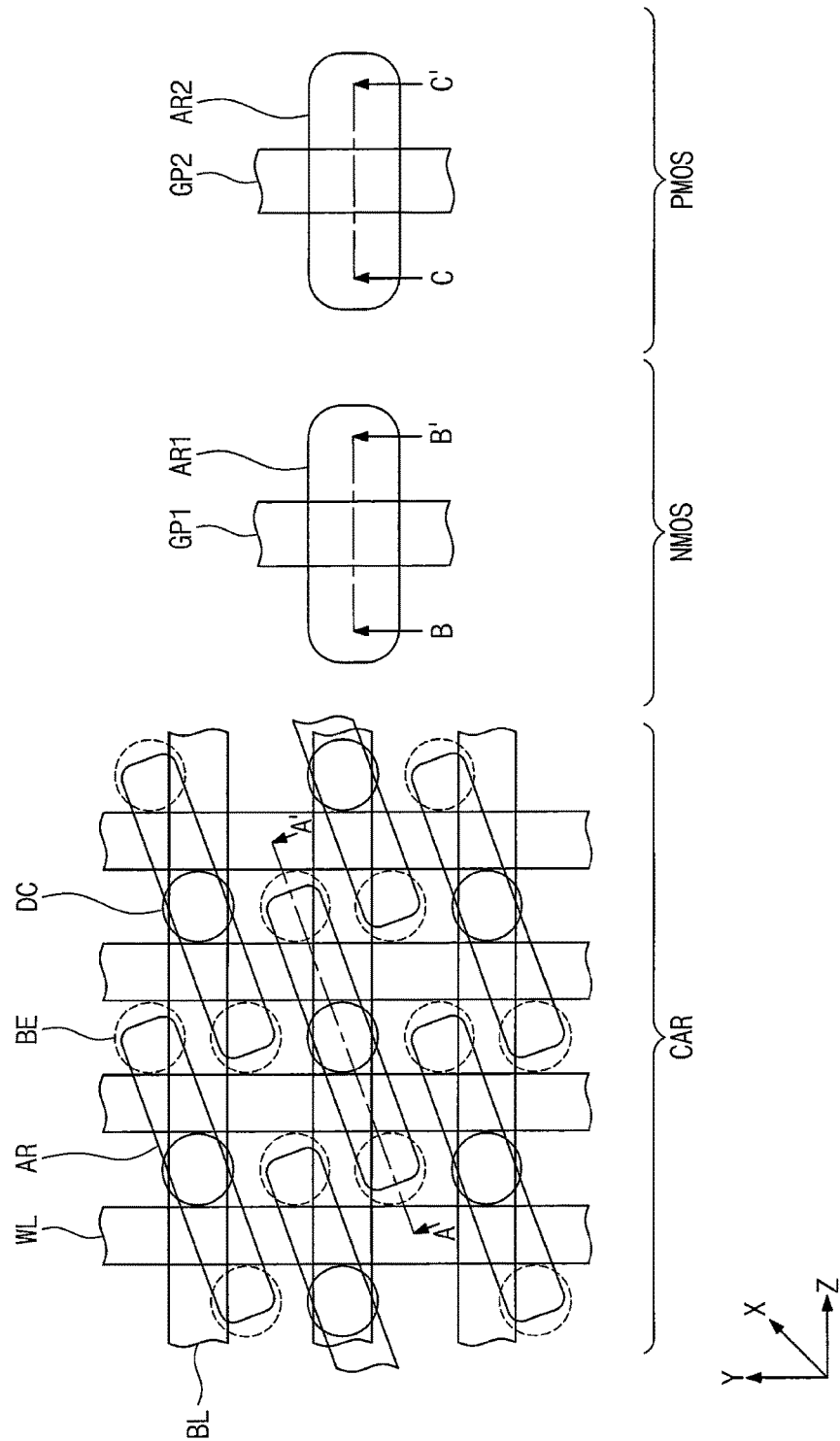
FIG. 1 is a plan view illustrating a semiconductor memory device according to example embodiments of the present inventive concepts.

FIG. 1 is a plan view illustrating a semiconductor memory device according to example embodiments of the present inventive concepts. FIGS. 2 through 5, 6A, 6B, and 7 through 10 are cross-sectional views taken along the lines A-A', B-B', and C-C' of FIG. 1 illustrating a method of fabricating a semiconductor memory device according to example embodiments of the present inventive concepts.

Figure 2:
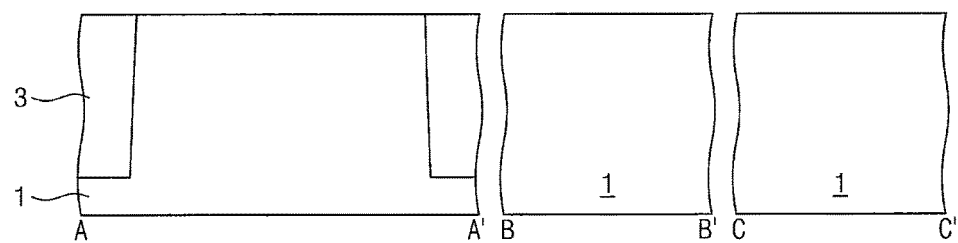
FIGS. 2, 3, 4, 5, 6A, 6B, 7, 8, 9 and 10 are cross-sectional views taken along the lines A-A', B-B', and C-C' of FIG. 1 illustrating a method of fabricating a semiconductor memory device according to example embodiments of the present inventive concepts.

Referring to FIGS. 1 and 2, a substrate 1 (e.g., a semiconductor substrate) may be provided. The substrate 1 may be formed of, for example, single crystalline silicon. The substrate 1 may include a first region CAR, a second region NMOS, and a third region PMOS. The first region CAR may be a cell array region where memory cells are formed. The second and third regions NMOS and PMOS may be a peripheral circuit region where peripheral circuits are disposed to drive the memory cells. Among the second and third regions NMOS and PMOS, the second region NMOS may be a region where one or more NMOS transistors are formed. The third region PMOS may be a region where one or more PMOS transistors are formed.

A device isolation layer 3 may be formed in the substrate 1 to define active regions AR, AR1, and AR2. The device isolation layer 3 may be formed of, for example, a silicon oxide layer, a silicon nitride layer, and/or a silicon oxynitride layer. A STI (Shallow Trench Isolation) method may be employed to form the device isolation layer 3. For example, the device isolation layer 3 may be formed by etching the substrate 1 to form a trench, filling the trench with an insulation layer, and performing a planarization process on the insulation layer. The active regions AR, AR1, and AR2 may include a cell active region AR, a first peripheral active region AR1, and a second peripheral active region AR2. The first region CAR may include plural cell active regions AR. In some embodiments, each of the cell active regions AR may have a bar shape extending in a first direction X as illustrated in FIG. 1. The substrate 1 may include well regions formed by implanting impurities whose conductivities are suitable for characteristics of corresponding regions CAR, NMOS, and PMOS.

Figure 3:
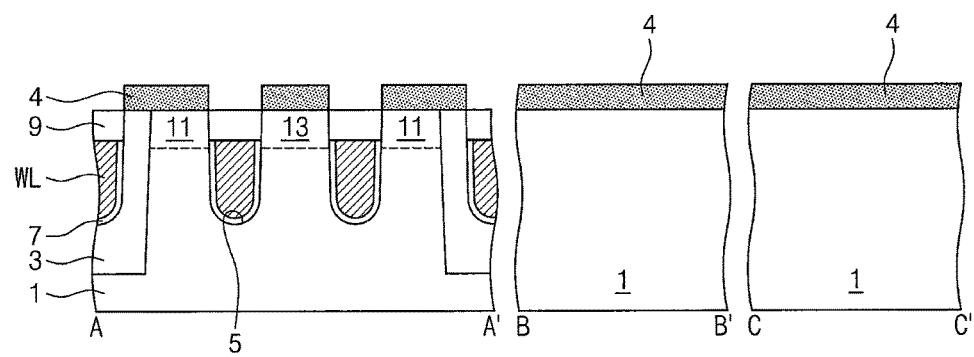

Referring to FIGS. 1 and 3, an ion implantation process may be performed to form first and second cell impurity regions 11 and 13 in the cell active region AR. In this step, the second and third regions NMOS and PMOS may be covered with a mask pattern so as not to form the cell impurity regions 11 and 13 in the second and third regions NMOS and PMOS. In some embodiments, the cell impurity regions 11 and 13 may not be formed in this step but may be formed in a subsequent step after forming word lines WL and a channel epitaxial layer (e.g., channel epitaxial layer 17 in FIG. 5). For example, the first cell impurity region 11 may correspond to a source of DRAM cell transistor, and the second cell impurity region 13 may correspond to a drain of DRAM cell transistor. The cell impurity regions 11 and 13 may be formed by doping, for example, N-type impurities.

A first mask pattern 4 may be formed on the substrate 1 and the device isolation layer 3. The first mask pattern 4 may be formed to have a plurality of line shapes, which extend on the first region CAR in a second direction Y crossing the first direction X and may cover all of the second and third regions NMOS and PMOS. The first mask pattern 4 may be formed to partially expose the cell active region AR. The first mask pattern 4 may be formed of, for example, a silicon oxide layer, a silicon nitride layer, and/or a silicon oxynitride layer. The first mask pattern 4 may be used as an etch mask to pattern the substrate 1 and the device isolation layer 3 on the first region CAR, so that a plurality of grooves 5 that are parallel to each other may be formed to extend in the second direction Y. A cell gate dielectric layer 7 may be formed to conformally cover inner walls of the grooves 5. A conductive layer may be formed to fill the grooves 5. An etch-back process may be performed on the conductive layer and the cell gate dielectric layer 7 to form a plurality of word lines WL extending in the second direction Y while leaving the cell gate dielectric layer 7 in each of the grooves 5 and exposing upper sidewalls of the grooves 5. A capping layer may be formed on the word lines WL and then an etch-back process may be performed to form a cell capping pattern 9 in an upper portion of each of the grooves 5. The cell capping pattern 9 may be formed of an insulating material such as a silicon nitride layer.

Figure 4:
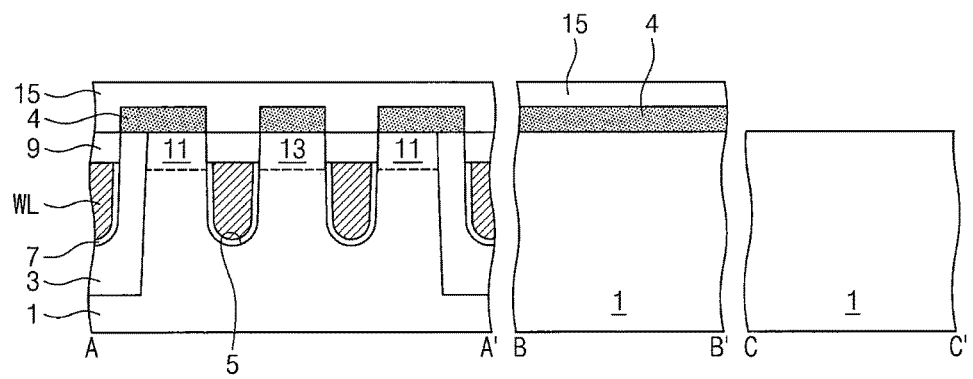

Referring to FIGS. 1 and 4, a second mask pattern 15 may be formed on the substrate 1 to cover the first and second regions CAR and NMOS and to expose the third region PMOS. The second mask pattern 15 may be formed of a material having an etch selectivity with respect to the first mask pattern 4. For example, the second mask pattern 15 may be a photoresist pattern. The second mask pattern 15 may be used as an etch mask to remove the first mask pattern 4 from the third region PMOS, and thus a top surface of the substrate 1 may be exposed on the third region PMOS.

Figure 5:
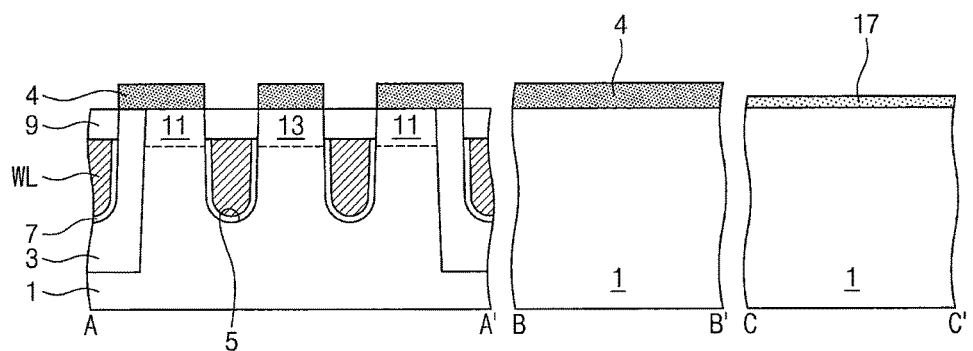

Referring to FIGS. 1 and 5, the second mask pattern 15 may be removed. A channel epitaxial layer 17 may be formed on the exposed top surface of the substrate 1 on the third region PMOS while using the first mask pattern 4 as an epitaxial barrier. The first mask pattern 4 may be used as a barrier to growth of the channel epitaxial layer 17 on the first region CAR and the second region NMOS while the channel epitaxial layer 17 is being formed on the third region PMOS. Accordingly, the channel epitaxial layer 17 may be selectively formed on the exposed top surface of the third region PMOS of the substrate 1 and may not be formed on the first region CAR and the second region NMOS of the substrate 1. The first mask pattern 4 may remain while the channel epitaxial layer 17 is being formed as illustrated in FIG. 5.

In some embodiments, the channel epitaxial layer 17 may be a silicon-germanium layer formed by, for example, a selective epitaxial growth method. In this step, as the first and second regions CAR and NMOS are covered with the first mask pattern 4, the channel epitaxial layer 17 may not be formed on the first and second regions CAR and NMOS. A ratio of germanium to silicon in the channel epitaxial layer 17 may be uniform or different along a thickness direction of the channel epitaxial layer 17 (i.e., a vertical direction from a lower surface of the channel epitaxial layer 17 that faces the substrate 1 toward an upper surface of the channel epitaxial layer 17 opposite the lower surface thereof.) For example, a ratio of germanium to silicon in the channel epitaxial layer 17 may increase along the vertical direction from the lower surface of the channel epitaxial layer 17 toward the upper surface of the channel epitaxial layer 17.

As the first mask pattern 4 is used to form the word lines WL on the first region CAR and is also used to selectively form the channel epitaxial layer 17 on the third region PMOS, no additional removal and formation of a mask pattern for forming the channel epitaxial layer 17 may be required. Accordingly, it may be possible to simplify a process and to reduce or possibly prevent surface damage to the substrate 1 and the device isolation layer 3.

Figure 6A:
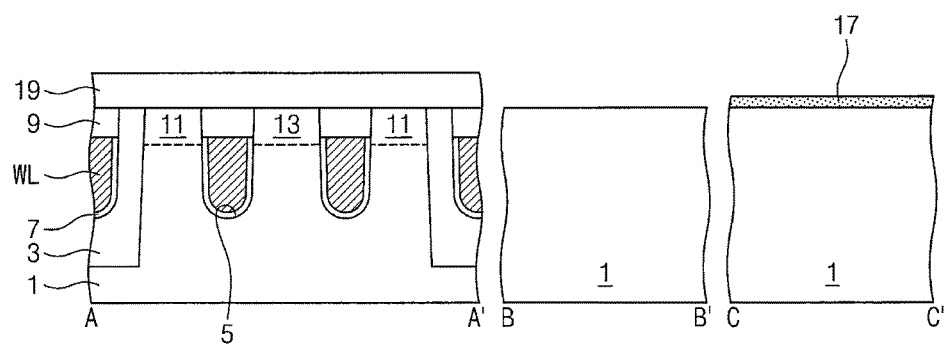
Figure 6B:
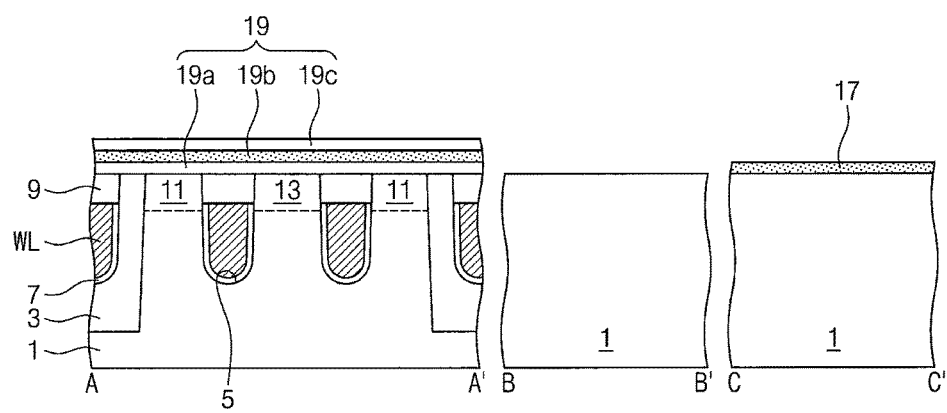

Referring to FIGS. 1, 6A, and 6B, the first mask pattern 4 may be removed to expose a surface of the substrate 1 on the first and second regions CAR and NMOS. A first interlayer dielectric layer 19 may be formed to cover the substrate 1 of the first region CAR. The first interlayer dielectric layer 19 may be formed by forming and patterning an insulation layer on an entire surface of the substrate 1. In some embodiments, the first interlayer dielectric layer 19 may be formed of a single insulation layer as shown in FIG. 6A. In some embodiments, the first interlayer dielectric layer 19 may be formed of multiple layers including first, second, and third sub-interlayer dielectric layers 19a, 19b, and 19c as shown in FIG. 6B. For example, in FIG. 6A, the first interlayer dielectric layer 19 may be a single silicon oxide layer. For example, in FIG. 6B, the first and third sub-interlayer dielectric layers 19a and 19c may be a silicon oxide layer, and the second sub-interlayer dielectric layer 19b may be a silicon nitride layer. The second sub-interlayer dielectric layer 19b of the first interlayer dielectric layer 19 in FIG. 6B may include a silicon nitride layer and thus may reduce or possibly prevent oxidation of the substrate 1 on the cell active regions AR during a subsequent high-temperature process by inhibiting permeation of oxygen or the like from the environment.

Figure 7:
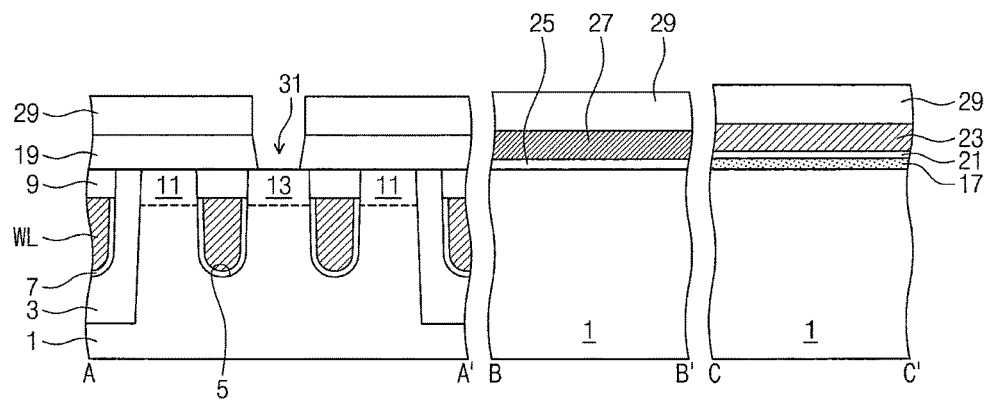

Referring to FIGS. 1 and 7, peripheral gate dielectric layers 21 and 25 and work function adjusting layers 23 and 27, which are suitable for characteristics of the second and third regions NMOS and PMOS, may be formed on the second and third regions NMOS and PMOS. For example, a first peripheral gate dielectric layer 25 and a first work function adjusting layer 27 may be formed on the second region NMOS corresponding to an NMOS region to achieve a desired performance (e.g., a threshold voltage) of an NMOS transistor. Likewise, a second peripheral gate dielectric layer 21 and a second work function adjusting layer 23 may be formed on the third region PMOS corresponding to a PMOS region to achieve a desired performance of a PMOS transistor.

The first and second peripheral gate dielectric layers 21 and 25 may include a high-k dielectric layer having a dielectric constant higher than a dielectric constant of silicon oxide (e.g., about 3.9). For example, the high-k dielectric layer may be oxide, nitride, silicide, oxynitride, or silicide oxynitride including hafnium (Hf), aluminum (Al), zirconium (Zr), and/or lanthanum (La). The first and second peripheral gate dielectric layers 21 and 25 may be composed of a single insulation layer or multiple insulation layers. The first and second peripheral gate dielectric layers 21 and 25 may have different thicknesses depending on desired performance of corresponding transistors. For example, a gate dielectric layer may be formed thicker for a high-voltage transistor than for a low-voltage transistor. The first and second work function adjusting layers 23 and 27 may be composed of a single or multiple metal-containing layers having a specific work function. The first and second work function adjusting layers 23 and 27 may be all conductive.

A third mask pattern 29 may be formed on the entire surface of the substrate 1. The third mask pattern 29 may be formed to cover the work function adjusting layers 23 and 27 on the second and third regions NMOS and PMOS and to include an opening 31 that exposes a portion of the first interlayer dielectric layer 19 on the first region CAR. The opening 31 of the third mask pattern 29 may be formed to vertically overlap the second cell impurity region 13. The first interlayer dielectric layer 19 may be etched using the third mask pattern 29 as an etch mask, and thus the opening 31 may be transferred to the first interlayer dielectric layer 19 to expose the second cell impurity region 13.

Figure 8:
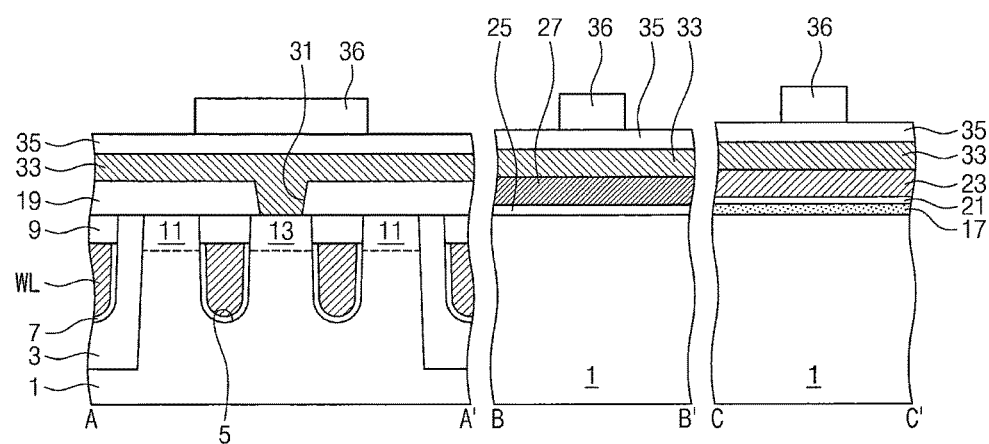

Referring to FIGS. 1 and 8, the third mask pattern 29 may be removed. Thereafter, a common conductive layer 33 may be formed on the entire surface of the substrate 1. The common conductive layer 33 may be commonly used for forming gate electrodes of the NMOS and/or PMOS transistors. For example, the common conductive layer 33 may include a metal layer such as a tungsten layer having low electrical resistance so as to enhance transmission speed of electrical signals. The common conductive layer 33 may further include a diffusion barrier layer that reduces or possibly prevents diffusion of metal such as tungsten. The second cell impurity region 13 may be in contact with the common conductive layer 33 with which the opening 31 is filled.

A capping layer 35 may be formed on the common conductive layer 33. The capping layer 35 may be formed of, for example, a silicon nitride layer. A fourth mask pattern 36 may be formed on the capping layer 35. On the first region CAR, the fourth mask pattern 36 may be formed to have a plurality of line shapes extending in a third direction Z crossing all of the first and second directions X and Y. Moreover, the fourth mask pattern 36 may be formed to have a shape for defining a first peripheral gate pattern GP1 and a second peripheral gate pattern GP2, which are described below with reference to FIG. 9, on the second and third regions NMOS and PMOS, respectively.

Figure 9:
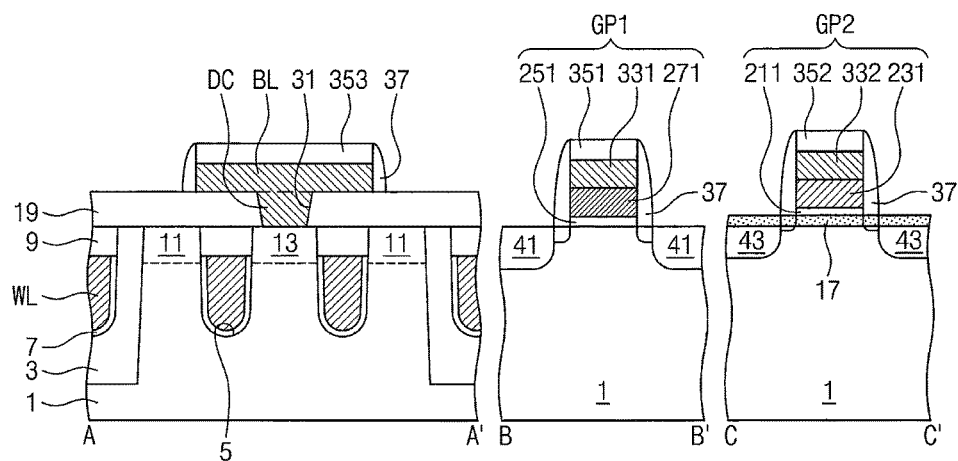

Referring to FIGS. 1 and 9, the capping layer 35 and the common conductive layer 33 may be sequentially etched using the fourth mask pattern 36 as an etch mask. In this step, on the first region CAR, the top surface of the first interlayer dielectric layer 19 may be exposed and the common conductive layer 33 may be transformed into a bit line BL. The bit line BL may be formed to have a plurality of line shapes extending in the third direction Z crossing all of the first and second directions X and Y. A bit line capping pattern 353 may be formed on the bit line BL. In addition, the opening 31 may be provided therein with a bit line contact DC integrally connected to the bit line BL.

On the second region NMOS, the fourth mask pattern 36 may be also used as an etch mask to sequentially etch the first work function adjusting layer 27 and the first peripheral gate dielectric layer 25 below the common conductive layer 33, which may form a first peripheral gate pattern GP1. The first peripheral gate pattern GP1 may include a first peripheral gate dielectric pattern 251, a first work function adjusting pattern 271, a first gate conductive pattern 331, and a first peripheral capping pattern 351 that are sequentially stacked. The first peripheral gate pattern GP1 may be a gate electrode of an NMOS transistor. The first work function adjusting pattern 271 may make the first peripheral gate pattern GP1 have a work function of, for example, about 4.1 eV.

On the third region PMOS, the fourth mask pattern 36 may be also used as an etch mask to sequentially etch the second work function adjusting layer 23 and the second peripheral gate dielectric layer 21 below the common conductive layer 33, which may form a second peripheral gate pattern GP2. The second peripheral gate pattern GP2 may include a second peripheral gate dielectric pattern 211, a second work function adjusting pattern 231, a second gate conductive pattern 332, and a second peripheral capping pattern 352 that are sequentially stacked. The second peripheral gate pattern GP2 may be a gate electrode of a PMOS transistor. The second work function adjusting pattern 231 may make the second peripheral gate pattern GP2 have a work function of, for example, about 5.3 eV. The channel epitaxial layer 17 may be used as a channel layer of a transistor including the second peripheral gate pattern GP2.

A spacer layer may be conformally formed on the entire surface of the substrate 1 and then anisotropically etched to form spacers 37 on sidewalls of the bit line BL, the first peripheral gate pattern GP1, and the second peripheral gate pattern GP2. After that, an ion implantation process may be performed to form first and second peripheral impurity regions 41 and 43. The first peripheral impurity region 41 may be formed in the first peripheral active region AR1 adjacent to a side of the first peripheral gate pattern GP1. For example, the first peripheral impurity region 41 may include N-type impurities, for example, V-group impurities such as phosphor (P). The second peripheral impurity region 43 may be formed in the second peripheral active region AR2 adjacent to a side of the second peripheral gate pattern GP2. For example, the second peripheral impurity region 43 may include P-type impurities, for example, III-group impurities such as boron (B). As such, an NMOS transistor may be formed to include the first peripheral gate pattern GP1, and a PMOS transistor may be formed to include the second peripheral gate pattern GP2. As the PMOS transistor uses a silicon germanium layer as the channel epitaxial layer 17, its performance may be improved due to enhancement of hole mobility, and its threshold voltage may effectively be controlled by adjustment of an energy band gap.

Figure 10:
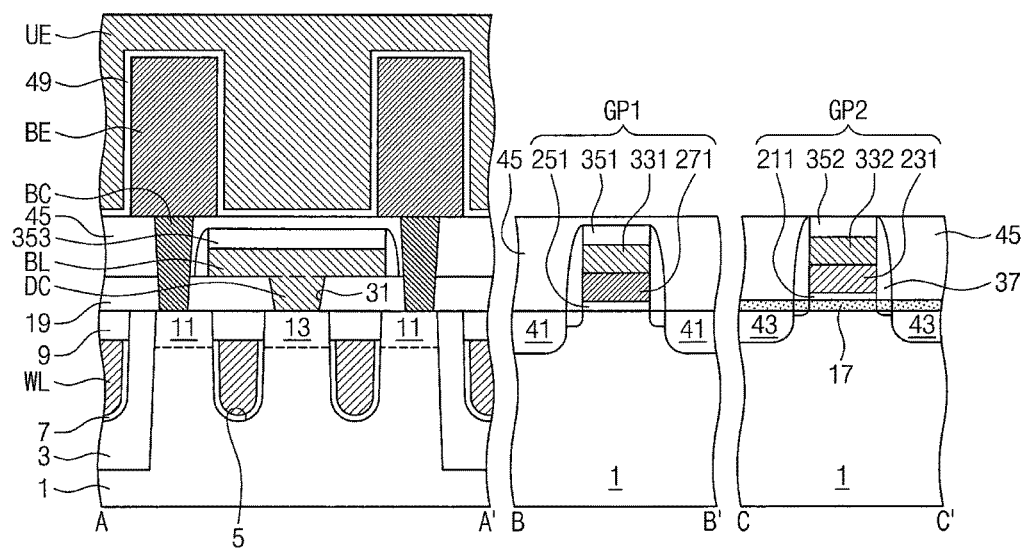

Referring to FIGS. 1 and 10, a second interlayer dielectric layer 45 may be formed on the entire surface of the substrate 1. On the first region CAR, a storage node contact BC may be formed to sequentially penetrate the second and first interlayer dielectric layers 45 and 19 so that the first cell impurity region 11 may be connected to the storage node contact BC. A data storage element may be disposed on the storage node contact BC. The data storage element may have various structural and/or electrical features according to types of memory devices. FIG. 10 shows a capacitor as the data storage element in the case that a dynamic random access memory (DRAM) is adopted as a semiconductor memory device according to the present inventive concepts. The capacitor may include a bottom electrode BE in contact with the storage node contact BC, a capacitor dielectric layer 49 conformally covering the bottom electrode BE, and a top electrode UE disposed on the capacitor dielectric layer 49.

Semiconductor memory devices according to the present inventive concepts, however, are not limited to the above-mentioned and may be variously embodied. For example, the data storage element may include a phase change material, a variable resistance material, or a magnetic tunnel junction pattern.

As discussed above, a highly integrated semiconductor memory device having excellent performance can be manufactured by a process simplified in accordance with a method of fabricating a semiconductor memory device according to example embodiments of the present inventive concepts.

In the method of fabricating a semiconductor memory device according to example embodiments of the present inventive concepts, a mask pattern employed to form buried-type word lines on a cell region may also be employed as a mask for forming a silicon germanium layer used as a channel layer of PMOS transistor. It thus may be possible to skip steps of removing the mask pattern and forming a separate mask pattern for forming the silicon germanium layer. As a result, a process may be simplified and damage to a substrate and/or a device isolation layer may be reduced or possibly prevented. In addition, the formation of the buried-type word lines may achieve high integration. Furthermore, as the silicon germanium layer is adopted as a channel layer of PMOS transistor, carrier mobility may be improved and a threshold voltage may be adjusted in comparison with the case a single crystalline silicon layer is adopted as the channel layer.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a memory device, the method comprising:
   providing a substrate comprising a first region and a second region;
   forming a mask pattern comprising a plurality of line-shaped portions that are parallel to each other and extend in a first direction on the first region of the substrate, the mask pattern extending on the second region of the substrate;
   forming a plurality of word line regions in the first region of the substrate using the mask pattern as a mask;
   forming a plurality of word lines in the plurality of word line regions, respectively;
   removing the mask pattern from the second region of the substrate to expose the second region of the substrate, the mask pattern remaining on the first region of the substrate after removing the mask pattern from the second region of the substrate; and
   forming a channel epitaxial layer on the second region of the substrate while using the mask pattern as a barrier to growth of the channel epitaxial layer on the first region of the substrate.

2. The method of claim 1, wherein the mask pattern comprises a silicon oxide layer, a silicon nitride layer, and/or a silicon oxynitride layer.

3. The method of claim 1, further comprising, after forming the channel epitaxial layer:
   removing the mask pattern from the first region of the substrate; and
   forming an interlayer dielectric layer on the first region of the substrate,
   wherein the interlayer dielectric layer comprises multiple layers comprising a silicon oxide layer and a silicon nitride layer.

4. The method of claim 1, further comprising, before forming the mask pattern:
   forming a device isolation layer in the substrate to define an active region; and
   forming first and second impurity regions in the active region, wherein one of the plurality of word lines is in the active region and between the first and second impurity regions.

5. The method of claim 4, further comprising:
   forming an interlayer dielectric layer on the first region of the substrate;
   forming a bit line contact extending through the interlayer dielectric layer and a bit line electrically connected to the bit line contact, wherein the bit line contact is electrically connected to the first impurity region, and the bit line extends in a second direction crossing the first direction on the interlayer dielectric layer; and
   forming a storage node contact extending through the interlayer dielectric layer and a data storage element connected to the storage node contact, wherein the storage node contact is electrically connected to the second impurity region, and a portion of the interlayer dielectric layer is between the data storage element and the bit line.

6. The method of claim 5, further comprising forming a PMOS gate pattern on the channel epitaxial layer on the second region of the substrate,
   wherein the bit line and the PMOS gate pattern comprise the same conductive layer.

7. A method of fabricating a memory device, the method comprising:
   providing a substrate comprising a cell array region and a PMOS region;
   forming a mask pattern comprising a plurality of line-shaped portions that are parallel to each other and extend in a first direction on the cell array region, the mask pattern extending on the PMOS region;
   forming a plurality of grooves that are parallel to each other on the cell array region by etching the substrate using the mask pattern as an etch mask;

sequentially forming gate dielectric layers, word lines, and capping patterns in the plurality of grooves, respectively;

removing the mask pattern from the PMOS region to expose the PMOS region, the mask pattern remaining on the cell array region after removing the mask pattern from the PMOS region; and selectively forming a silicon germanium (SiGe) layer on the PMOS region while using the mask pattern as a barrier to growth of the silicon germanium layer on the cell array region.

8. The method of claim 7, wherein the mask pattern comprises a silicon oxide layer, a silicon nitride layer, and/or a silicon oxynitride layer.

9. The method of claim 7, wherein the substrate further comprises an NMOS region, and wherein, while the silicon germanium layer is being formed on the PMOS region, the mask pattern is on the NMOS region and is used as a barrier to growth of the silicon germanium layer on the NMOS region.

10. The method of claim 7, further comprising, after forming the silicon germanium layer:

removing the mask pattern; and forming an interlayer dielectric layer on the cell array region.

11. The method of claim 10, wherein the interlayer dielectric layer comprises multiple layers comprising a silicon oxide layer and a silicon nitride layer.

12. The method of claim 10, further comprising:

forming a bit line electrically connected to a portion of the cell array region that is adjacent a first side of one of the word lines; and forming a PMOS gate pattern on the silicon germanium layer on the PMOS region, wherein the bit line and the PMOS gate pattern comprise the same conductive layer.

13. A method of forming a memory device, the method comprising:

forming a mask layer on a substrate that comprises a first region and a second region, the mask layer comprising a first opening exposing the first region and extending on the second region;

etching the substrate using the mask layer as an etch mask to form a recess in the first region of the substrate;

forming a word line in the recess;

removing the mask layer from the second region of the substrate after forming the word line, to expose the second region of the substrate;

forming an epitaxial layer on the exposed second region of the substrate;

sequentially forming an insulation layer and a conductive layer on the epitaxial layer; and patterning the conductive layer to form a gate electrode of a transistor on the epitaxial layer, the epitaxial layer comprising a channel region of the gate electrode of the transistor.

14. The method of claim 13, wherein the mask layer remains on the first region of the substrate while the epitaxial layer is being formed.

15. The method of claim 14, further comprising removing the mask layer from the first region of the substrate after forming the epitaxial layer.

16. The method of claim 13, further comprising forming an interlayer insulation layer on the first region of the substrate after forming the word line, wherein the interlayer insulation layer comprises a second opening exposing the first region of the substrate, and the second opening is adjacent the word line, wherein forming the conductive layer comprises forming the conductive layer in the second opening and on the interlayer insulation layer, and wherein patterning the conductive layer comprises patterning the conductive layer formed on the interlayer insulation layer to form a conductive line on the first region of the substrate.

17. The method of claim 13, further comprising forming a capping pattern in the recess on the word line before removing the mask layer from the second region of the substrate.

18. The method of claim 13, wherein the epitaxial layer comprises silicon and germanium.

19. The method of claim 18, wherein a ratio of germanium to silicon in the epitaxial layer increases along a direction from a lower surface of the epitaxial layer that faces the substrate toward an upper surface of the epitaxial layer that is opposite the lower surface of the epitaxial layer.

20. The method of claim 13, further comprising:

forming a work function adjusting layer on the insulation layer before forming the conductive layer; and patterning the work function adjusting layer after patterning the conductive layer, wherein the gate electrode of the transistor comprises the work function adjusting layer and the conductive layer.

* * * * *